(12) United States Patent
Roppongi

(10) Patent No.: US 6,600,906 B1
(45) Date of Patent: Jul. 29, 2003

(54) UP/DOWN CONVERTER

(75) Inventor: Satoshi Roppongi, Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/428,849

(22) Filed: Oct. 28, 1999

(30) Foreign Application Priority Data

Oct. 30, 1998 (JP) .......................................... 10-310930

(51) Int. Cl.$^7$ ................................................ H04B 1/04
(52) U.S. Cl. ...................... 455/118; 455/112; 455/318; 327/355
(58) Field of Search ................................. 455/112, 315, 455/118, 119, 314, 318, 330, 444; 327/355

(56) References Cited

U.S. PATENT DOCUMENTS

| | | | |
|---|---|---|---|
| 4,075,565 A | * | 2/1978 | Kazuo .......................... 332/170 |
| 4,262,361 A | * | 4/1981 | Hauer .......................... 455/113 |
| 5,063,357 A | * | 11/1991 | Williams et al. .............. 331/49 |
| 6,282,413 B1 | * | 8/2001 | Baltus .......................... 455/255 |

OTHER PUBLICATIONS

Cutler et al., "RF Vector Signal Analyzer Hardware Design" HP Journal, pp 47–59.
Manassewitsch, "Frequency Synthesizers Theory and Design", Wiley and Sons, pp100–105, 134–141.

* cited by examiner

Primary Examiner—Thanh Cong Le
Assistant Examiner—Tan Trinh

(57) ABSTRACT

The invention provides an up/down converter with low phase noise. Signals from a first local oscillator are fed through a power splitter to first and second mixers. Signals from a second local oscillator and signals from the power splitter are mixed by the second mixer. The frequency component of the difference between the two signals is removed by a first bandpass filter and passed to a third mixer. Input signals are mixed with signals from the power splitter by the first mixer, and the lower frequency component of the output signals from the first mixer is removed by a second bandpass filter and is passed to the third mixer. Signals from the first and second bandpass filters are mixed by the third mixer. The higher frequency component of the output signals is removed by a low pass filter and is output.

6 Claims, 5 Drawing Sheets

UP/DOWN CONVERTER

FIELD OF THE INVENTION

The present invention pertains to a frequency up/down converter.

BACKGROUND OF THE INVENTION

Frequency up/down converters (referred to below as up/down converters) are known as a technology for frequency conversion. FIG. 1 shows a diagram of a conventional up converter and FIG. 2 shows a diagram of a conventional down converter.

First, a conventional up converter will be described while referring to FIG. 1. First local oscillator LO1 124 of the up converter in FIG. 1 is typically a low phase-noise signal source of a fixed frequency and second local oscillator LO2 126 is a low phase-noise signal source of a variable frequency. In FIG. 1, signals given to input terminal 110 are passed through BPF (band pass filter) 112 and mixed with signals from LO1 124 (of a predetermined fixed frequency) by mixer 114 and the frequency component of the difference between the two signals is removed, that is, the frequency component of the sum of the two signals, is produced by BPF 116. There is further mixing with signals output at a predetermined frequency from LO2 126 by mixer 118 and the frequency component of the sum of the two signals is removed by LPF (low pass filter) 120 and output to output terminal 122.

In this case, assuming that signal f110 given to input terminal 110 is $$f110 = \cos(w\_if * t) \tag{1}$$

as a signal without phase noise, signal f124 output from LO1 is $$f124 = \cos(w2*t + \theta pn2(t)) \tag{2}$$

with phase noise as θpn2(t), and signal f126 from LO2 is $$f126 = \cos(w3*t + \theta pn3(t)) \tag{3}$$

with phase noise as θpn3(t), first intermediate frequency signal IF1 at the output of mixer 114 is the product of both signals f110 and f124. To summarize, $$IF1 = \cos(w\_if * t) * \cos(w2 * t + \theta pn2(t)) \tag{4}$$
$$= (\cos((w\_if + w2) * t + \theta pn2(t)) +$$
$$\cos((w\_if - w2) * t - \theta pn2(t)))/2$$

Furthermore, in this specification, the formulas representing signals that have passed through mixers or filters focus on the relationship with frequency for what needs explanation, but persons skilled in the art can alter the formulas as needed for amplitude, and therefore, the details are not given special mention. Therefore, the phrase "to summarize" has been used when the formulas are introduced.

Next, the lower frequency components are removed by BPF 116, and therefore, signal f116 at the output of BPF 116 becomes $$f116 = \cos((w\_if + w2) * t + \theta pn2(t)) \tag{5}$$

When frequency is converted by mixer 118, second intermediate frequency signal IF2 at the output of mixer 118 becomes $$IF2 = \cos(w3*t + \theta pn3(t)) * \cos((w\_if + w2) * t + \theta pn2(t)) \tag{6}$$
$$= (\cos((w3 + w\_if + w2) * t + \theta pn3(t) + \theta pn2(t)) +$$
$$\cos((w3 - w\_if - w2) * t + \theta pn3(t) - \theta pn(t)))/2$$

The higher frequency components are removed by LPF 120 here, and therefore, signal f120 at the output of LPF 120 becomes $$f120 = \cos((w3 - w\_if - w2)*t + \theta pn3(t) - \theta pn2(t)) \tag{7}$$

In formula (7), since θpn3(t) and θpn2(t) are non-correlated noise from different signal sources, these phase noises are added to the signal f120 to output terminal 122 and given to output. The results relating to phase noise here would not be different, if the component of lower frequency from first intermediate frequency IF1 was used.

Next, a conventional down converter will be described while referring to FIG. 2. First local oscillator LO1 226 of the down converter in FIG. 2 is a low phase-noise signal source of variable frequency and second local oscillator LO2 224 is a low phase-noise signal source of fixed frequency. The signal given to input terminal 222 passes through LPF 220 in FIG. 2 in order to remove images of frequency components and is mixed with a signal of a predetermined frequency from first local oscillator LO1 226 by mixer 218. The frequency component of the sum of both signals is removed by BPF 216, and further mixing with signals (of a predetermined fixed frequency) from second local oscillator LO2 224 is performed by mixer 214. The frequency component of the sum of the two signals is removed by BPF 212 and, then the result is output to output terminal 210.

In this case, assuming that input signal f222 of input terminal 222 is $$f222 = \cos(w\_in * t) \tag{8}$$

as a signal without phase noise, signal f226 from first local oscillator LO1 is $$f226 = \cos(w1*t + \theta pn1(t)) \tag{9}$$

with phase noise as θpn1(t), and signal f224 from second local oscillator LO2 224 is $$f224 = \cos(w2*t + \theta pn2(t)) \tag{10}$$

with phase noise as θpn2(t), first intermediate frequency signal IF1 at the output of mixer 218 becomes the product of input signal f222 and signal f226 from LO1 and $$IF1 = \cos(w1*t + \theta pn1(t)) * \cos(w\_in * t) \tag{11}$$
$$= (\cos((w1 + w\_in) * t + \theta pn1(t)) +$$
$$\cos((w1 - w\_in) * t + \theta pn1(t)))/2$$

Here, the higher component is removed by BPF 216 and therefore, signal f216 at the output of BPF216 becomes $$f216 = \cos((w1 - w\_in)*t + \theta pn1(t)) \tag{12}$$

Next, when frequency is converted by mixer 214, second intermediate frequency signal IF2 at the output of mixer 214 becomes $$IF2 = \cos((w1 - w\_in)*t + \theta pn1(t))*\cos(w2*t + \theta pn2(t)) \quad (13)$$
$$= (\cos((w1 - w\_in + w2)*t + \theta pn1(t) + \theta pn2(t)) +$$
$$\cos((w1 - w\_in - w2)*t + \theta pn1(t) - \theta pn2(t)))/2$$

and when the higher component is dropped by BPF 212, signal f212 at the output of BPF 212 becomes $$f212 = \cos((w1 - w\_in - w2)*t + \theta pn1(t) - \theta pn2(t)) \quad (14)$$

In formula (14), since θpn3(t) and θpn2(t) are non-correlated noise from different signal sources, these phase noises are added to output signals and are given to output.

Accordingly, there is a disadvantage with conventional up/down converters in that phase noise from internal signal sources is obtained in the output and it becomes necessary to use a high-performance internal signal source with low phase-noise in order to keep phase noise to lower.

In particular, signal sources 124 and 224 of fixed frequency in conventional up/down converters must have as high an output frequency as signal sources 126 and 226 of variable frequency. In general, as higher the output frequency becomes in a signal source, the phase noise level also increases. Therefore, a signal source with low phase-noise is needed, even when used as the signal source of fixed frequency, and as a result, the up/down converter becomes expensive.

Therefore, when this type of conventional converter is used in systems such as IC testers, etc., the cost of developing a dedicated fixed frequency signal source increases and becomes expensive. Moreover, output frequency cannot be varied, and therefore, this signal source cannot be flexibly used with other modules. Consequently, the problems with these conventional converters are two-fold.

Therefore, there was a need for a high-frequency up/down converter with which phase noise is reduced even if a low-cost ordinary signal source is used.

SUMMARY OF THE INVENTION

In order to solve the abovementioned problems, the purpose of the present invention is to present an up/down converter with which phase noise is reduced, even when an ordinary signal source is employed.

Another purpose of the present invention is to present a low-cost device or method for presenting a high-frequency up/down converter with low phase-noise.

In order to accomplish this purpose, in the first aspect of the present invention there is provided an up converter comprising: a first local oscillator; a first mixer means for mixing input signals and signals from the first local oscillator and producing a frequency component of the sum of the two frequency signals; a second local oscillator; a second mixer means for mixing the signals from the first local oscillator and the second local oscillator and producing the frequency component of the sum of the two; and a third mixer means for mixing the signals from the first and second mixer means and producing the frequency component of the difference between the two signals.

In order to accomplish this purpose, in the second aspect of the present invention, the up converter according to the first aspect of the invention, further comprises a power splitter connected to the first local oscillator for splitting signals and feeding signals to the first and the second mixer means.

In order to accomplish this purpose, in the third aspect of the present invention, the up converter according to the first aspect of the invention, further comprises a first amplifier between the second and the third mixer means.

In order to accomplish this goal, in the fourth aspect of the present invention, an up converter comprises: a first local oscillator; a power splitter connected to the first local oscillator for splitting signals, a first mixer connected to one of outputs from the power splitter and input signals for mixing the signals from both; a first filter connected to the first mixer for removing the frequency component of the difference between two frequencies of the signals that have been input to the first mixer; a second local oscillator; a second mixer connected to the second local oscillator and another output from the power splitter for mixing the signals from both; a second filter connected to the second mixer for removing the frequency component of the difference between the signals that have been input to the second mixer; a third mixer connected to the first and second filters for mixing the signals from the two filters; and a third filter connected to the third mixer for removing the frequency component of the sum of two frequencies of the signals that have been input to the third mixer.

In order to accomplish this purpose, in the fifth aspect of the present invention, the up converter according to the fourth aspect of the invention, further comprises a first amplifier between the second filter and the third mixer.

In order to accomplish this purpose, in the sixth aspect of the present invention, the up converter according to the second aspect of the invention, further comprises: a second amplifier between the power splitter and the first mixer; and a third amplifier between the power splitter and the second mixer.

In order to accomplish this purpose, in the seventh aspect of the present invention, the up converter according to the sixth aspect of the invention, further comprises a delay element between the power splitter and the third amplifier.

In order to accomplish this purpose, in the eighth aspect of the present invention, the up converter according to the sixth aspect of the invention, further comprises a delay element between the third amplifier and the second mixer.

In order to accomplish this purpose, in the ninth aspect of the present invention, in the up converter according to the first aspect of the invention, the first local oscillator is a fixed-frequency oscillator and the second local oscillator is a variable-frequency oscillator.

In order to accomplish this purpose, in the tenth aspect of the present invention, a down converter comprises: a first local oscillator; a second local oscillator; a first mixer means for mixing the signals from the second local oscillator with the signals from the first local oscillator and producing the frequency component of the sum of the two; an input terminal; a second mixer means for mixing the signals from the input terminal and the signals from the first mixer means and producing the frequency component of the difference between the two; and a third mixer means for mixing the signals from the first local oscillator and the signals from the second mixer means and producing the frequency component of the difference between the two.

In order to accomplish this purpose, in the eleventh aspect of the present invention, the down converter according to the tenth aspect of the invention, further comprises a power splitter connected to the first local oscillator for splitting signals and feeding signals to the first and the third mixer means.

In order to accomplish this purpose, in the twelfth aspect of the present invention, the down converter according to the tenth aspect of the invention, further comprises a fourth filter connected between the input terminal and the second mixer means for producing a component within a predetermined frequency range of the signals from the input terminal.

In order to accomplish this purpose, in the thirteenth aspect of the present invention, the down converter according to the tenth aspect of the invention, further comprises a first amplifier between the first mixer and second mixer.

In order to accomplish this purpose, in the fourteenth aspect of the present invention, a down converter comprises: a first local oscillator; a power splitter connected to the output of the first local oscillator for splitting signals; a second local oscillator; a first mixer connected with the second local oscillator and an output from the power splitter for mixing the two signals; a first filter connected with the first mixer for removing the frequency component of the difference between signals that have been input to the first mixer; an input terminal; a second mixer connected to the input terminal and the first filter for mixing signals from both; a second filter connected to the second mixer for removing the frequency component of the sum of signals input to the second mixer; a third mixer connected t o another output from the power splitter and the second filter for mixing the signals from the two; and a third filter connected to the third mixer for removing the frequency component of the sum of signals input to the third mixer In order to accomplish this purpose, in the fifteenth aspect of the present invention, the down converter according to the fourteenth aspect of the invention, further comprises a fourth filter for producing the component within a predetermined frequency range of signals from the input terminal between the input terminal and the second mixer.

In order to accomplish this purpose, in the sixteenth aspect of the present invention, the down converter according to the fourteenth aspect of the invention, further comprises a first amplifier between the first filter and the second mixer.

In order to accomplish this purpose, in the seventeenth aspect of the present invention, the down converter according to the eleventh aspect of the invention, further comprises: a second amplifier between the power splitter and the first mixer; and a third amplifier between the power splitter and the third mixer.

In order to accomplish this purpose, in the eighteenth aspect of the present invention, the down converter according to the seventeenth aspect of the invention, further comprises a delay element between the power splitter and the third amplifier.

In order to accomplish this purpose, in the nineteenth aspect of the present invention, the down converter according to the seventeenth aspect of the invention, further comprises a delay element between the third amplifier and the third mixer.

In order to accomplish this purpose, in the twentieth aspect of the present invention, the first local oscillator in the down converter according to the tenth aspect of the invention, is a fixed-frequency oscillator and the second local oscillator is a variable-frequency oscillator.

DETAILED DESCRIPTION OF THE INVENTION

Figure 1:
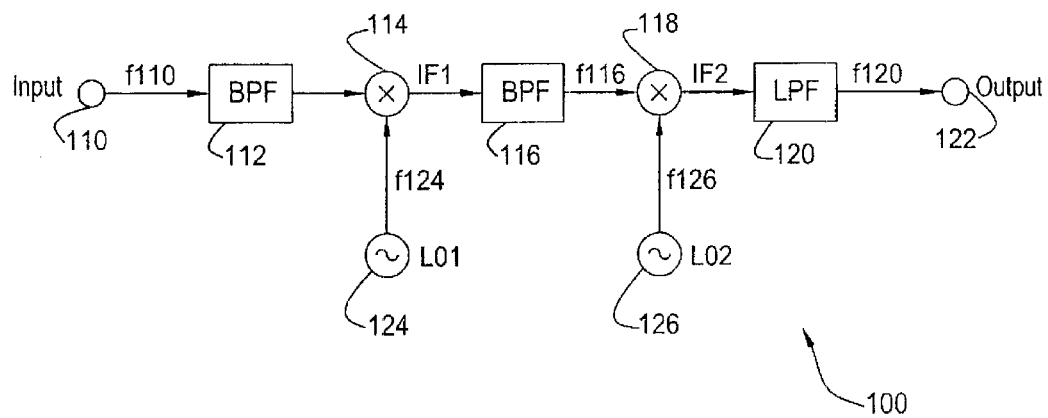
FIG. 1 is a block diagram of a conventional up converter.
Figure 2:
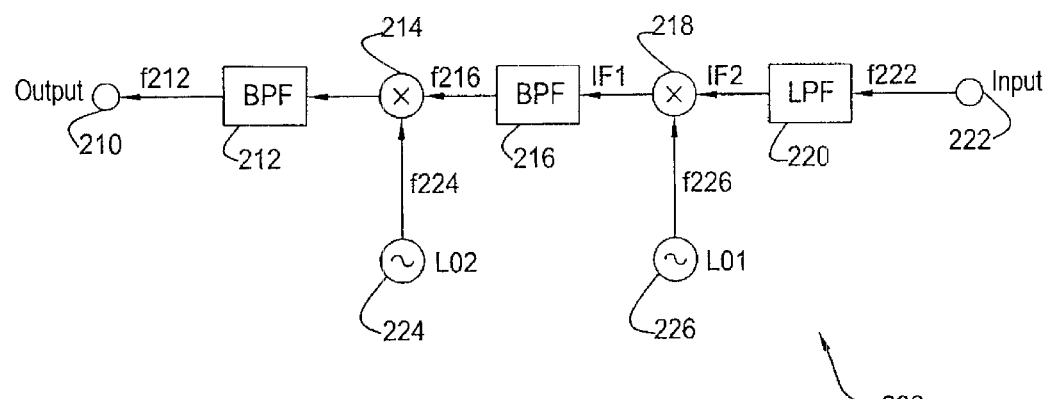
FIG. 2 is a block diagram of a conventional down converter.
Figure 3:
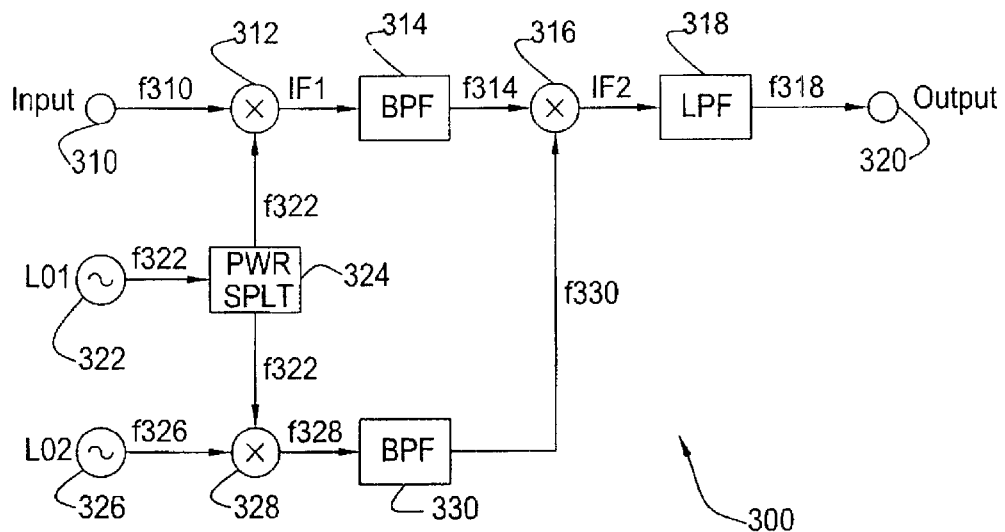
FIG. 3 is a block diagram of an embodiment of an up converter of the present invention.

A basic embodiment of the up converter of the present invention is shown in FIG. 3. First local oscillator 322 is preferably a fixed-frequency signal source that feeds signals from signal source 322 through power splitter (PWR SPLT) 324 to mixers 312 and 328. Second local oscillator LO2 326 is preferably a variable-frequency signal source with which frequency sweep is possible. Signals from this signal source 326 and signals from power splitter 324 are mixed by mixer 328 and the frequency component of the difference between the two signals is removed by BPF (band pass filter) 330, that is, the frequency component of the sum of two signals that have been input to mixer 328 is produced and given to mixer 316.

On the other hand, the input signals that have been given to input terminal 310 are mixed with signals from power splitter 324 by mixer 312. The output signals from mixer 312 are given to mixer 316 after BPF 314 removes the lower frequency component.

Signals from BPF 330 and signals from BPF 314 are mixed by mixer 316 and the higher frequency component of these output signals is removed by LPF (low pass filter) 318, that is, the frequency component of the difference between two signals input to mixer 316 is produced and output from output terminal 320.

Here, assuming that input signal f310 which is input is $$f310 = \cos(w\_if * t) \tag{15}$$

without phase noise; signal f322 from first local oscillator LO1 is $$f322 = \cos(w2*t + \theta pn(t)) \quad (16)$$

with phase noise as θpn(t); and signal f326 from second local oscillator LO2 is $$f326 = \cos(w1*t) \quad (17)$$

Signal f326 is mixed with signal f322 from the first oscillator and converted to high frequency, and therefore, signal f326 itself is output at lower frequency, and therefore, a signal with low phase noise can be obtained. As a result, the phase noise of signal f326 is low enough to be negligible.

To summarize, first intermediate frequency signal IF1 of mixer 312 becomes $$IF1 = \cos(w\_if*t) * \cos(w2*t + \theta pn(t)) \quad (18)$$
$$= (\cos((w\_if + w2)*t + \theta pn(t)) +$$
$$\cos((w\_if - w2)*t - \theta pn(t)))/2$$

Consequently, to summarize, signal f314 after the lower component has been removed by BPF314 becomes as shown below $$f314 = \cos((w\_if+w2)*t+\theta pn(t)) \quad (19)$$

while signal f328 at the output of mixer 328 becomes $$f328 = \cos(w1*t) * \cos(w2*t + \theta pn(t)) \quad (20)$$
$$= (\cos((w1 + w2)*t + \theta pn(t)) +$$
$$\cos((w1 - w2)*t - \theta pn(t)))/2$$

and when the lower component is eliminated by BPF 330, signal f330 at the output of BPF 330 becomes $$f330 = \cos((w1+w2)*t+\theta pn(t)) \quad (21)$$

Thus, second intermediate frequency signal IF2 at the output of mixer 316 becomes $$IF2 = \cos((w1 + w2)*t + \theta pn(t)) * \cos((w\_if + w2)*t + \theta pn(t)) \quad (22)$$
$$= (\cos((w1 + 2*w2 + w\_if)*t + 2*\theta pn(t)) +$$
$$\cos((w1 - w\_if)*t))/2$$

To summarize, since the higher frequency component is removed from this by LPF 318, signal f318 at the output of LPF 318, that is, the signal output to output terminal 320 becomes $$f318 = \cos((w1-w\_if)*t) \quad (23)$$

and phase noise from local oscillator LO1 322 is canceled out, and has no effect on output terminal 320.

For instance, when this up converter has a signal source of 3.6 GHz and 505 MHz to 3.395 GHz, respectively, for local oscillators LO1 and LO2, and signals of 495 MHz are given to input signals f310, signals of 10 MHz to 2.9 GHz can be output as signals f318. Thus, if the frequency of LO2 is high, the phase noise at the output can be reduced for one oscillator (LO2) and when the frequency of LO2 is low, the phase noise level of LO2 is lower than that of higher frequency, and the phase noise at the output can be reduced even further.

Figure 4:
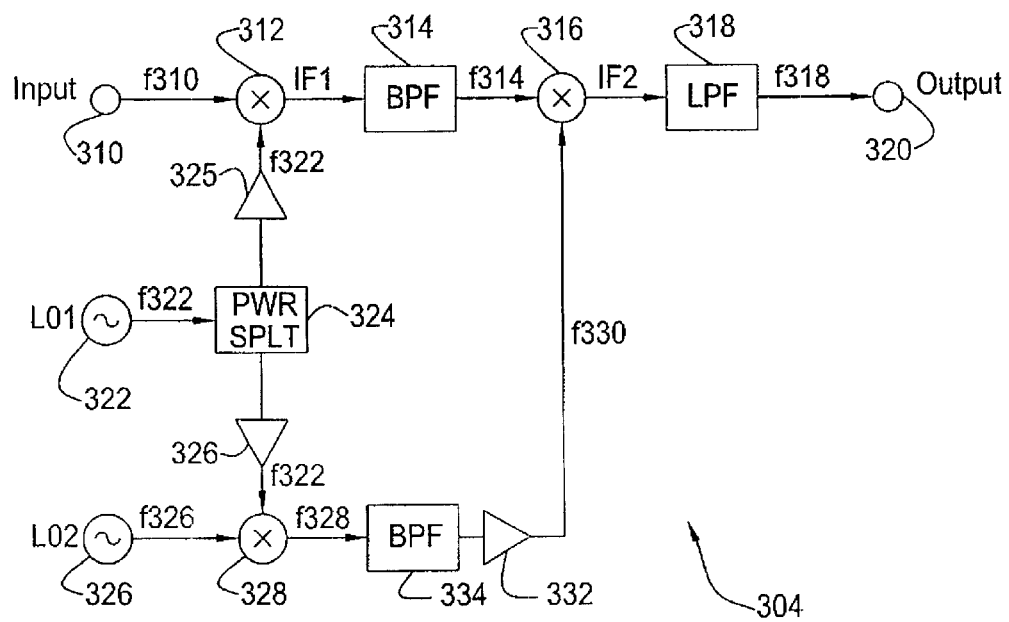
FIG. 4 is a block diagram of another embodiment of an up converter of the present invention.

FIG. 4 shows another embodiment of the up converter of the present invention. The structural elements in the embodiment in FIG. 4 that are the same as those in the example in FIG. 3 will be identified using the same reference symbols. Amplifier 332 in the embodiment in FIG. 4 amplifies signals enough to drive mixer 316.

In addition to the role of BPF 330 in FIG. 3, BPF 334 is connected between mixer 328 and amplifier 332 in order to reduce the high-level spurious noise generated by mixer 328 or signal leakage from signal source LO1 322 and its harmonics. This BPF 334 is used in combination with a BPF and notch filter. Moreover, in order to further eliminate the spurious noise, a filter can be added on the output side of amplifier 332.

Amplifiers 325 and 326 amplify the signals enough to drive mixers 312 and 328 at the corresponding connection ends and are connected in order to obtain sufficient reverse isolation, that is, attenuation in the opposite direction. For instance, if there is not enough attenuation capability in the opposite direction, unnecessary spurious noise will return to the other up/down converter from an up converter and this will result in a residual response and output spurious noise when used with another up/down converter in a system such as an IC tester.

The actual operation of another example in FIG. 4 will be omitted because it is the same as the description of FIG. 3.

Figure 5:
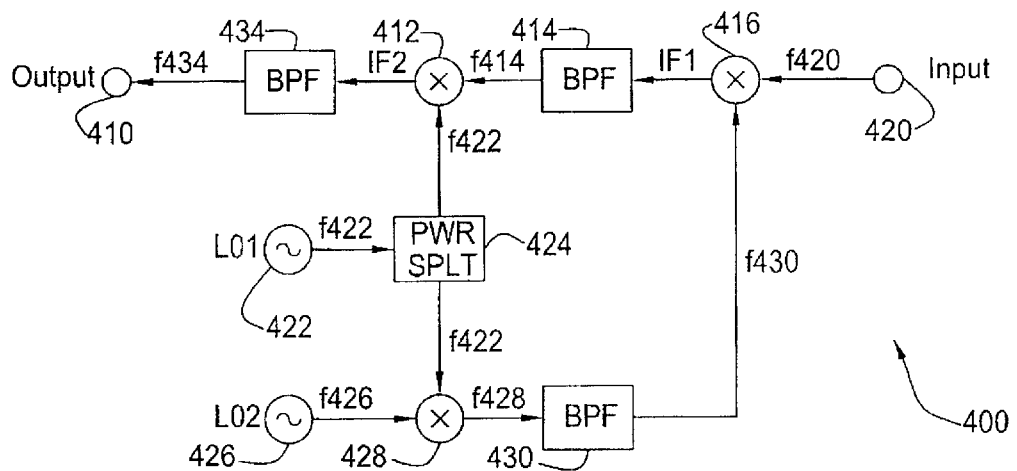
FIG. 5 is a block diagram of an embodiment of a down converter of the present invention.

Next, a basic embodiment of the down converter in the present invention is shown in FIG. 5. First local oscillator LO1 422 is preferably a fixed-frequency signal source that feeds signals through power splitter 424 to mixers 412 and 428. Second local oscillator LO2 426 is preferably a variable-frequency signal source capable of frequency sweeping. The signals from LO2 426 are mixed with signals from power splitter 424 by mixer 428. The frequency component of the difference between the two signals is removed by BPF 430 and given to mixer 416.

On the other hand, the input signals given to input terminal 420 are mixed with signals from BPF 430 by mixer 416. The higher frequency component of signals at the output of mixer 416, that is, first intermediate frequency signals IF1, is removed by BPF 414 and given to mixer 412.

Signals from BPF 414 and signals from power splitter 424 are mixed by mixer 412 and the higher frequency component of their output signals, that is, second intermediate frequency signal IF2 is removed by BPF 434 and output to output terminal 410.

Here, assuming that input signal f420 is $$f420 = \cos(w\_in*t) \quad (24)$$

without phase noise; input signal f422 from first local oscillator LOI 422 is $$f422 = \cos(w2*t+\theta pn(t)) \quad (25)$$

with phase noise as θpn(t); and signal f426 from second local oscillator LO2 426 is $$f426 = \cos(w1*t) \quad (26)$$

Signal f426 is converted to high frequency by being mixed with signal f422 from first local oscillator LO1 422 and therefore, second local oscillator LO2 426 itself outputs at low frequency, and therefore, signals of low phase noise can be obtained. Here, the phase noise of signal f426 is low enough to be negligible.

To summarize, signal f428 at the output of mixer 428 becomes $$f428 = \cos(w1*t)*\cos(w2*t+\theta pn(t)) \quad (27)$$
$$= (\cos(w1+w2)*t+\theta pn(t)) +$$
$$\cos((w1-w2)*t-\theta pn(t)))/2$$

The lower component is removed by BPF 430, and therefore, to summarize, signal f430 at the output of BPF 430 becomes $$f430=\cos((w1+w2))*t+\theta pn(t)) \quad (28)$$

Consequently, the signals at the output of mixer 416, that is, first intermediate frequency signals IF1, become $$IF1 = \cos((w1+w2)*t+\theta pn(t))*\cos(w\_in*t) \quad (29)$$
$$= (\cos((w1+w2+w\_in)*t+\theta pn(t)) +$$
$$\cos((w1+w2-w\_in)*t+\theta pn(t)))/2$$

and since the higher frequency component is removed by BPF 414, signal f414 at the output of BPF 414 becomes $$f414=\cos((w1+w2-w\_in)*t+\theta pn(t)) \quad (30)$$

When this is mixed by mixer 412 with signal f422 from first local oscillator LO1 422, signals at the output of mixer 412, that is, second intermediate frequency signals IF2 become $$IF2 = \cos((w1+w2-w\_in)*t+\theta pn(t))*\cos(w2*t+\theta pn(t)) \quad (31)$$
$$= (\cos((w1+2*w2-w\_in)*t+2*\theta pn(t)) +$$
$$\cos((w1-w\_in)*t))/2$$

Here, the higher component is removed by BPF 434, and therefore, the signal at the output of BPF 434, that is, signal f434 output to output terminal 410 becomes $$f434=\cos((w1-w\_in)*t) \quad (32)$$

The phase noise from first local oscillator LOI 422 is canceled out and does not affect output 410.

As an example, when this down converter has signal sources of 3.6 GHz and 505 MHz to 3.395 GHz for local oscillators LO1 and LO2, respectively, and signals of 10 MHz to 2.9 GHz are given to the input signals, signals of 495 MHz can be output to output terminal 410.Thus, when the frequency of LO2 is high, the phase noise in the output can be reduced for one oscillator (LO2), while if the frequency of LO2 is low, the phase noise level of LO2 is lower than that of higher frequency and the phase noise at the output can be reduced even further.

Figure 6:
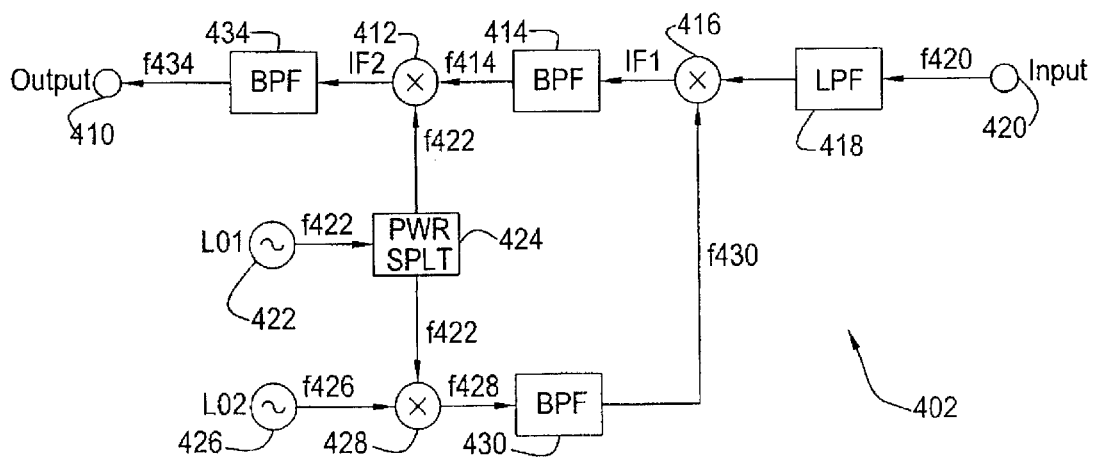
FIG. 6 is a block diagram of another embodiment of a down converter of the present invention.

FIG. 6 shows another embodiment of the down converter of the present invention. The structural elements in FIG. 6 that are the same as those in FIG. 5 are represented by the same symbols. In the embodiment in FIG. 6, LPF 418 is connected between input terminal 420 and mixer 416 and the unnecessary frequency components in the input signals are removed. The rest of the actual operation of the embodiment in FIG. 6 is the same as in FIG. 5 and therefore will not be described.

Figure 7:
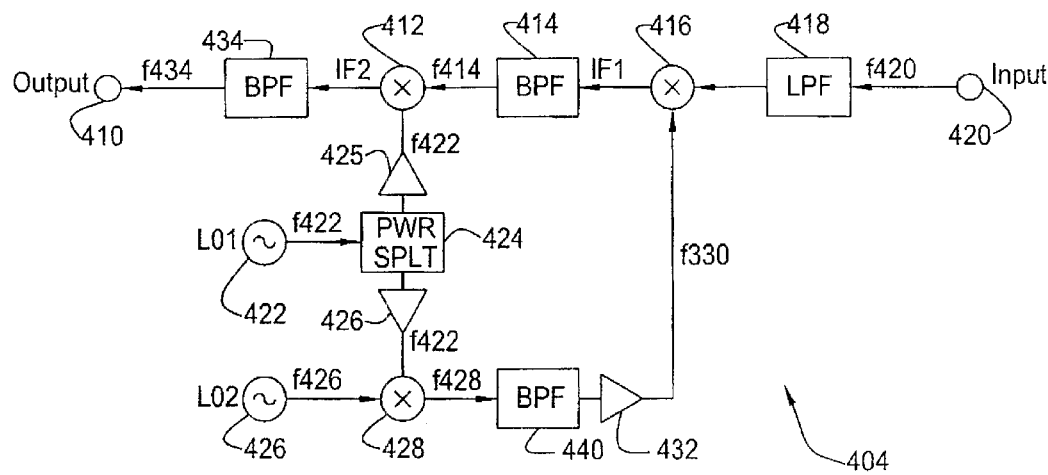
FIG. 7 is a block diagram of yet another embodiment of a down converter of the present invention.

FIG. 7 shows yet another embodiment of the down converter of the present invention. The structural elements in FIG. 7 that are the same as in FIGS. 5 and 6 are represented by the same symbols. Amplifier 432 in the embodiment in FIG. 7 amplifies signals enough to drive mixer 416.

In addition to the role of BPF 430 in FIG. 5, BPF 440 is connected between mixer 428 and amplifier 432 in order to reduce the high-level spurious noise generated by the mixer, and leakage of signals from signal source LO1 422 and its harmonics. Thus, spurious response and residual spurious noise can be alleviated. BPF 440 can be used in combination with a BPF and a notch filter. Moreover, a filter can be added to the output side of amplifier 432 in order to further eliminate spurious noise.

Amplifiers 425 and 426 amplify the signals enough to drive mixers 412 and 428 at the corresponding connection ends and are connected in order to obtain sufficient reverse isolation, that is, attenuation in the opposite direction. For instance, if there is not enough attenuation capability in the opposite direction, unnecessary spurious noise will return to the other up/down converter from an up converter, and this will result in residual response and output spurious noise, when used with another up/down converter in a system such as an IC tester, etc. Moreover, they are used to prevent the phenomenon whereby signals of signal source LO2 leak from mixer 428 through power splitter 424 to mixer 412 and are mixed and observed as residual response from the output terminal.

The rest of the actual operation of the embodiment in FIG. 7 is the same as in FIG. 5 and therefore will not be described here.

Figure 8:
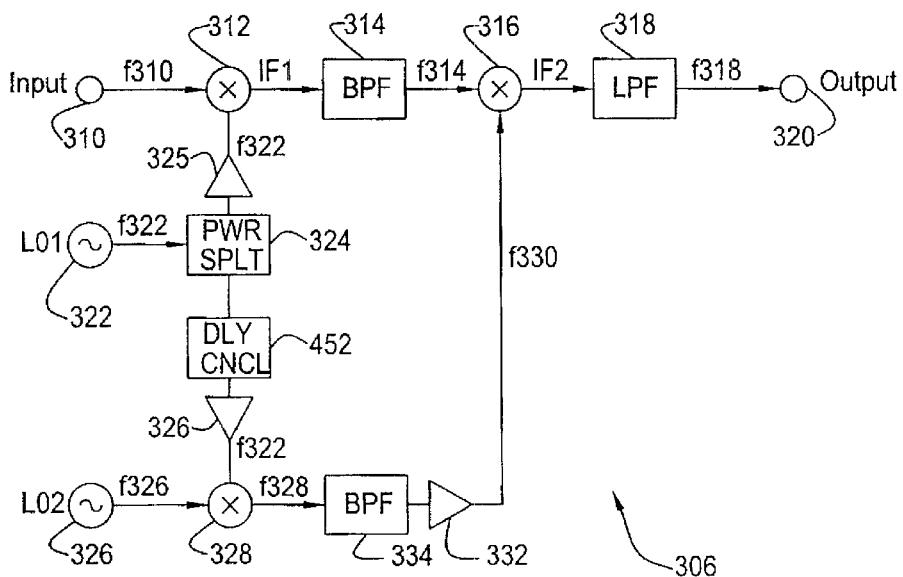
FIG. 8 is a block diagram of another embodiment of an up converter of the present invention.
Figure 9:
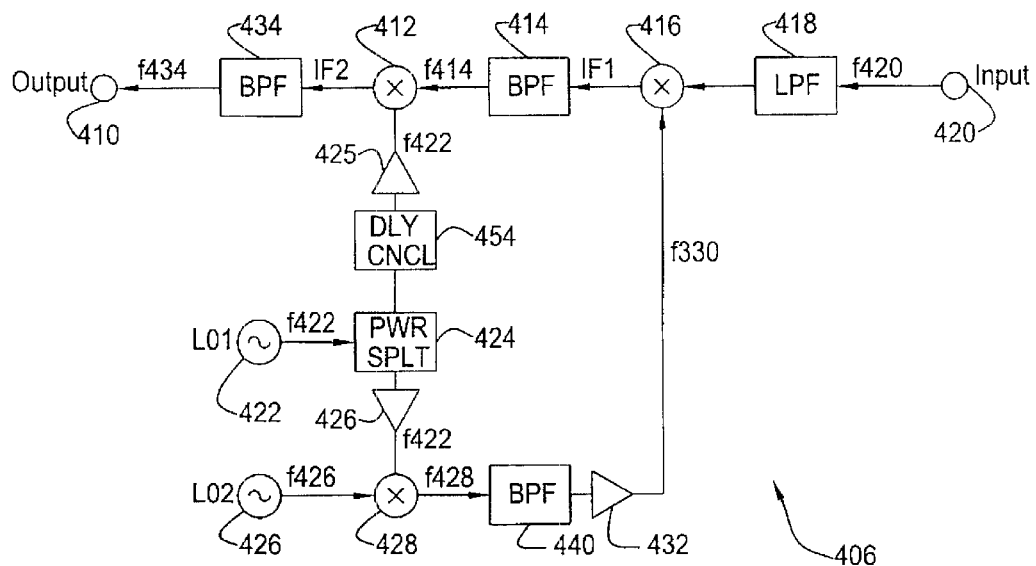
FIG. 9 is a block diagram of another embodiment of a down converter of the present invention.

If the difference of the signal delay is too large between the paths through which the signals from LO1 will be transmitted, the effect of canceling out the phase noise of local oscillator LO1 322 or 422 of the up/down converter of the present invention will not be realized. However, it is possible to restore this effect by using a delay canceler that will cancel the delay signals along the signal path of LO1. FIG. 8 shows an embodiment of the up converter of the present invention where delay canceler (DLY CNCL) 452 is connected between power splitter 324 and amplifier 326. Or, delay canceler 452 can also be connected between amplifier 326 and mixer 328. Moreover, FIG. 9 shows an embodiment of the down converter of the present invention where delay canceler (DLY CANCL) 454 has been connected between power splitter 424 and amplifier 425. Or, delay canceler 454 can also be connected between amplifier 425 and mixer 412. Delay cancelers 452 and 454 comprises a BPF or a delay line.

Figure 10:
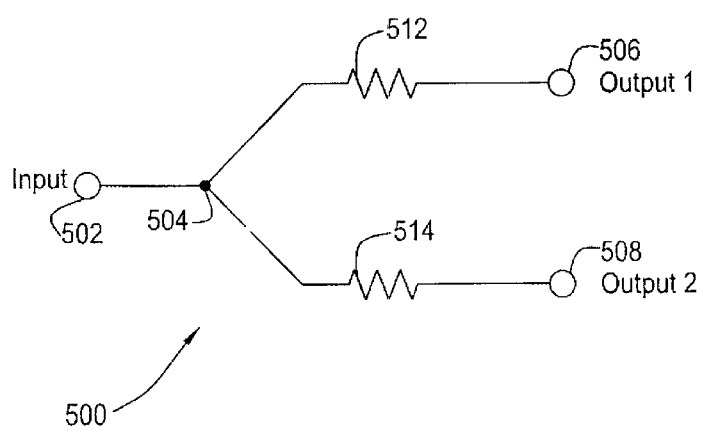
FIG. 10 is a diagram of a power splitter.

FIG. 10 shows general actual examples of power splitters 324 and 424 shown in FIGS. 3 through 9. In FIG. 10, power splitter 500 has a line from input terminal 502 that splits in two and resistors 512 and 514 at these split ends, and is connected to output-1 terminal 506 and output-2 terminal 508.

However, the power splitter used in the present invention is not necessarily the embodiment in FIG. 10 and can be a device based on this idea, where eventually two outputs that is similar to the input signal which was given to the input can be obtained. For instance, there can be a 3-resistance-type power divider (Y or Δ type). Moreover, it is possible to use a 1:multiple power divider that splits from one place into a multiple number of up/down converters.

In addition, it can also be a power combiner, a directional bridge or a coupler. When these are used, the isolation between two corresponding output terminals in FIG. 10 will increase and therefore, amplifiers 325, 326, 425 and 426 can be amplifiers with a small reverse attenuation, and, depending on the case, the amplifiers can be removed.

As previously explained, when the present invention is used, the phase noise from one of two signal sources can be canceled, and therefore, it presents an up/down converter or a method whereby phase noise is reduced.

Moreover, when the present invention is used, the output frequency on the side of two local oscillators (signal sources) where phase noise has not been canceled out in an up/down converter can be lower when compared to conventional converters, and therefore, an up/down converter or its method with which phase noise can be reduced even further can be presented.

Furthermore, by means of the present invention, it is possible to use an ordinary signal source that does not show good phase noise properties as the signal source of two signal sources from which phase noise will be canceled and therefore, a low-cost up/down converter or its method is presented.

Therefore, by means of the present invention, an ordinary signal source can be used and therefore, it is easy to design the converter so that the signal source can be flexibly used in other modules when combined in a system. Therefore, the present invention presents a flexible up/down converter system or its method.

What is claimed is:

1. An up converter comprising:

a first local oscillator;

a power splitter connected to the first local oscillator for splitting signals, a first mixer connected to one of outputs from the power splitter and input signals for mixing the signals from both;

a first filter connected to the first mixer for removing the frequency component of the difference between two frequencies of the signals that have been input to the first mixer;

a second local oscillator;

a second mixer connected to the second local oscillator and another output from the power splitter for mixing the signals from both;

a second filter connected to the second mixer for removing the frequency component of the difference between the signals that have been input to the second mixer;

a third mixer connected to the first and second filters for mixing the signals from the two filters; and a third filter connected to the third mixer for removing the frequency component of the sum of two frequencies of the signals that have been input to the third mixer.

2. The up converter according to claim 1, further comprising a first amplifier between the second filter and the third mixer.

3. The up converter according to claim 1, further comprising:

a second amplifier between the power splitter and the first mixer; and a third amplifier between the power splitter and the second mixer.

4. The up converter according to claim 3, further comprising a delay element between the power splitter and the third amplifier.

5. The up converter according to claim 3, further comprising a delay element between the third amplifier and the second mixer.

6. The up converter according to claim 1, wherein the first local oscillator is a fixed-frequency oscillator and the second local oscillator is a variable-frequency oscillator.

* * * * *